United States Patent
Hembacher et al.

(10) Patent No.: US 10,989,897 B2
(45) Date of Patent: *Apr. 27, 2021

(54) OPTICAL ELEMENT FOR THE BEAM GUIDANCE OF IMAGING LIGHT IN PROJECTION LITHOGRAPHY

(71) Applicant: Carl Zeiss SMT GmbH, Oberkochen (DE)

(72) Inventors: Stefan Hembacher, Bobingen (DE); Marwene Nefzi, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/923,057

(22) Filed: Jul. 7, 2020

(65) Prior Publication Data
US 2020/0333557 A1    Oct. 22, 2020

Related U.S. Application Data

(63) Continuation of application No. PCT/EP2019/050055, filed on Jan. 3, 2019.

(30) Foreign Application Priority Data

Jan. 22, 2018    (DE) .......................... 102018200954.6

(51) Int. Cl.
*G03F 7/20*    (2006.01)
*G02B 7/182*    (2021.01)
(Continued)

(52) U.S. Cl.
CPC ........... *G02B 7/182* (2013.01); *G02B 5/0891* (2013.01); *G02B 26/0825* (2013.01);
(Continued)

(58) Field of Classification Search
CPC .. G02B 5/0891; G02B 7/182; G02B 26/0825; G03F 7/70033; G03F 7/7015; G03F 7/702; G03F 7/70258; G03F 7/70316
(Continued)

(56) References Cited

U.S. PATENT DOCUMENTS 4,632,523 A * 12/1986 Knohl ................... G02B 7/183
359/848
10,007,186 B2    6/2018 Prochnau et al.
(Continued)

FOREIGN PATENT DOCUMENTS

DE    10 2005 044 716 A1    4/2007
DE    10 2013 214 989 A1    8/2014
(Continued)

OTHER PUBLICATIONS

Translation of German Examination Report for corresponding DE Appl No. 10 2018 200 954.6, dated Sep. 17, 2018.
(Continued)

*Primary Examiner* — Colin W Kreutzer
(74) *Attorney, Agent, or Firm* — Fish & Richardson P.C.

(57) ABSTRACT

An optical element serves for the beam guidance of imaging light in projection lithography. The optical element has a main body and at least one optical surface carried by the main body. At least one coupling unit is arranged on the main body. The coupling unit serves to attach a compensation weight element for compensating a figure deformation of the optical surface. The result is an optical element which can be provided at the use location with a relatively small figure deformation.

20 Claims, 8 Drawing Sheets

(51) Int. Cl.
*G02B 5/08* (2006.01)
*G02B 26/08* (2006.01)

(52) U.S. Cl.
CPC ............ *G03F 7/702* (2013.01); *G03F 7/7015* (2013.01); *G03F 7/70033* (2013.01); *G03F 7/70258* (2013.01); *G03F 7/70316* (2013.01)

(58) Field of Classification Search
USPC .......................................................... 355/67
See application file for complete search history.

(56) References Cited

U.S. PATENT DOCUMENTS

| | | | |
|---|---|---|---|
| 2004/0212794 A1 | 10/2004 | Mizuno | |
| 2007/0058269 A1 | 3/2007 | Mann et al. | |
| 2017/0192360 A1* | 7/2017 | Prochnau | G03F 7/7015 |
| 2020/0150544 A1* | 5/2020 | Prochnau | G02B 7/182 |

FOREIGN PATENT DOCUMENTS

| | | |
|---|---|---|
| DE | 10 2014 218 969 A1 | 4/2016 |
| DE | 10 2015 106 184 A1 | 10/2016 |
| EP | 1 806 610 B1 | 12/2011 |
| WO | WO 2007/033964 A1 | 3/2007 |
| WO | WO 2009/053023 A2 | 4/2009 |
| WO | WO 2012/013559 A1 | 2/2012 |
| WO | WO 2016/045778 A1 | 3/2016 |
| WO | WO 2016/166080 A1 | 10/2016 |
| WO | WO 2016/170043 A1 | 10/2016 |
| WO | WO 2016/188934 A1 | 12/2016 |

OTHER PUBLICATIONS

International search report and Written Opinion for corresponding PCT Appl. No. PCT/EP2019/050055, dated Apr. 11, 2019.

* cited by examiner

OPTICAL ELEMENT FOR THE BEAM GUIDANCE OF IMAGING LIGHT IN PROJECTION LITHOGRAPHY

CROSS-REFERENCE TO RELATED APPLICATIONS

The present application is a continuation of, and claims benefit under 35 USC 120 to, international application PCT/EP2019/050055, filed Jan. 3, 2019, which claims benefit under 35 USC 119 of German Application No. 10 2018 200 954.6, filed Jan. 22, 2018. The entire disclosure of these applications are incorporated by reference herein.

FIELD

The disclosure relates to an optical element for the beam guidance of imaging light in projection lithography. Further, the disclosure relates to a method for producing such an adjusted optical element, an imaging optical unit having at least one such optical element, an optical system including such an imaging optical unit, a projection exposure apparatus including such an optical system, a method for producing a microstructured or nanostructured component using such a projection exposure apparatus, and a microstructured or nanostructured component produced by the method.

BACKGROUND

An optical element for the beam guidance of imaging light in projection lithography is known from DE 10 2013 214 989 A1. Imaging optical units of the type set forth at the outset are known from WO 2016/188934 A1 and WO 2016/166080 A1.

SUMMARY

The disclosure seeks to provide an optical element having a relatively small figure deformation at a use location.

In a general aspect, the disclosure provides an optical element for the beam guidance of imaging light in projection lithography. The optical element includes a main body and at least one optical surface carried by the main body. The optical element also includes at least one coupling unit arranged on the main body for attaching a compensation weight element for compensating a figure deformation of the optical surface.

According to the disclosure, it was recognized that at least one coupling unit for attaching a compensation weight element can provide the option of compensating, such as for compensating the weight of, a figure deformation of the optical surface of the optical element. Depending on the desired compensation properties, an appropriate compensation weight element can be attached to the main body by way of the coupling unit. Here, the mass and the form of the compensation weight element can be fitted to respective properties of the figure deformation to be effected and to desired structural properties. Attaching the compensation weight element by way of the coupling unit to the main body can be implemented in a detachable and, optionally, reversible fashion. The coupling unit can be embodied in such a way that a positioning of the compensation weight element, attached by this coupling unit to the main body, relative to the main body in the three degrees of freedom of translation and, optionally, in the three degrees of freedom of rotation, too, is better than 250 µm, for example, has a tolerance of no more than 100 µm. Such a positional accuracy, which can be achieved by way of the coupling unit, can also be significantly better; i.e. it can be better than 100 µm and can also be better than 50 µm.

A figure deformation to be compensated can be due to production processes and optionally due to gravity as well. It was recognized that the demands on the figure accuracy, i.e. on the correspondence of the form of optical surfaces of the optical elements to the beam guidance of imaging light, can be so high in projection lithography that a gravitational force, which acts directly or indirectly on the optical surface, for example the exact magnitude of the gravitational force at the use location of the projection exposure apparatus, the constituent part of which is the considered optical element, plays a role. It was therefore recognized that it can be desirable to take account of a figure deformation of the optical surface caused by gravity, which can be dependent on the use location. The at least one compensation weight element of the optical element can ensure an appropriate weight compensation, and so it is possible to compensate effects on the optical surface caused by gravity, such as force differences caused by gravity and the influence thereof on the figure between a mirror production location on the one hand and a mirror use location on the other hand. A further example of a figure deformation caused by gravity, which can be compensated with the aid of the at least one compensation weight, is a deformation of the optical surface on account of force transmission, caused by gravity, between the main body of the optical element and a bearing of the optical element, for example in a holding frame.

In some embodiments, the optical element is a mirror, and the coupling unit is arranged on the main body at a mirror rear side that is applied by the optical surface. Such a configuration was found to be particularly suitable in some cases. The compensation weight elements can be attached to the mirror rear side, without these disturbing the optical surface. As an alternative or in addition thereto, the at least one compensation weight element can be attached to the edge of the optical element, for example to the edge of the mirror.

In some embodiments, the at least one coupling unit is arranged on the main body in the region of a centre-of-mass axis of the optical element Attaching at least one compensation weight element in such a way can ensure an effect of a compensation weight element attached in this manner that is as symmetrical as possible in some cases. Then, attaching exactly one compensation weight element suffices in many cases. In principle, it is also possible to attach a plurality of compensation weight elements to the main body in the region of a centre-of-mass axis of the optical element. By way of example, attaching a plurality of compensation weight elements like that in the region of a centre-of-mass axis is suitable in situations in which the centre-of-mass axis itself is not accessible for the attachment of a compensation weight element, for example if a passage opening in the main body of the optical element is present there. In such a case, a compensation weight element or a plurality of compensation weight elements can be arranged in the region of an edge of such a passage opening such that, to a good approximation, the weight effect of the at least one compensation weight element on the centre-of-mass axis arises. As an alternative or in addition to the arrangement variants of the coupling units explained above, which lead to corresponding arrangement options for the compensation weight elements, at least one compensation weight element can be attached radially between the centre-of-mass axis of the optical element and an outer edge region of the optical element. At least two such radially arranged compensation weight elements, for example arranged on the same radius between the centre-of-mass axis and the outer edge region of the optical element, are also possible.

In some embodiments, the main body, on the circumferential side, is borne by way of a plurality of bearing sites in a bearing receptacle of a holding frame of the optical element, wherein at least one coupling unit is arranged between two bearing sites that are adjacent to one another in the circumferential direction. In such a configuration, additional degrees of freedom that deviate from a rotational symmetry can be used in a targeted manner in the weight compensation of a figure deformation of the optical surface caused by gravity. Such coupling units attached on the circumferential side can also be used without a corresponding coupling unit in the region of the centre-of-mass axis of the optical element. A plurality of coupling units also can be arranged between two bearing sites that are adjacent to one another in the circumferential direction.

In some embodiments, respectively one coupling unit is arranged between all bearing sites that are adjacent to one another in the circumferential direction. Such a configuration according to was found to be particularly expedient in some cases.

In some embodiments, a compensation weight element is connected to the main body by way of the coupling unit. Such an arrangement can yield advantages corresponding to those disclosed herein with reference to the coupling unit or the possible arrangements of the compensation weight elements. By way of the at least one compensation element, it is possible to correct an overcompensation, such as a negative deformation allowance, for prescribing a nominal surface form of the optical surface or for correcting the figure. Not all coupling units present on the optical element need to be equipped with compensation weight elements. It is possible to use a plurality of compensation weight elements, which are attached to the main body by different coupling units. As an alternative or in addition thereto, it is possible to connect a plurality of compensation weight elements to the main body by way of one and the same coupling unit. In this way, the arrangement of coupling unit and compensation weight element can be such that there is only the introduction of gravitational force and/or an additional introduction of torque into the main body.

In some embodiments, a compensation weight storing device, by which the optical element is automatically equipped with compensation weight elements, can facilitate flexible equipping of the optical element with compensation weight elements. This can be used to correct figure deformations that are determined during operation at the use location, or else to compensate other imaging aberrations such that the optical element can then be used as an active correction element.

In a general aspect, the disclosure provides a method for producing an adjusted optical element disclosed herein. The method can include: producing a blank of the optical element including the at least one coupling unit, taking account of a negative deformation allowance; measuring the form of the optical surface; attaching at least one compensation weight element to the main body of the optical element via the coupling unit for the purposes of compensating a figure deformation of the optical surface.

Such a method can yield advantages corresponding to those which disclosed herein in conjunction with the optical element. Attaching the at least one compensation weight element can be carried out before or after moving the blank to the use location of the apparatus for projection lithography. An adjustment step for the optical element within the respective assembly still can follow the compensation weight element attachment step. The optical element can be a constituent part of a projection optical unit and/or a constituent part of an illumination optical unit of the projection exposure apparatus. The form of the optical surface can be measured at the use location, which may differ from the production location. The form of the optical surface can be measured taking account of, or simulating, the conditions at the use location. Such conditions can be a gravitational acceleration at the use location, which differs from the production location, or can be formed by holding influences or an installation position of the optical element.

In some embodiments, an intended surface form of the optical surface within predetermined tolerance limits is obtained at the production location by attaching compensating compensation weight elements.

In some embodiments, further compensation weight elements are attached at the use location for the purposes of compensating a use-location-dependent figure deformation of the optical surface.

In some embodiments, an optical unit includes an optical element disclosed herein and an illumination optical unit for illuminating the object field with illumination light from a light source. In some embodiments, a projection exposure apparatus includes such an optical system and a light source for producing the illumination light. In some embodiments, a method for producing a structured component includes: providing a reticle and a wafer; projecting a structure on the reticle onto a light-sensitive layer of the wafer with the aid of such a projection exposure apparatus; and producing a microstructure or nanostructure on the wafer. In some embodiments, the disclosure provides such a structured components. Advantages of such an imaging optical unit, such a projection exposure apparatus, such a production method for microstructured or nanostructured components, and such a microstructured or nanostructured component can correspond to those described herein reference to an optical element. For example, a semiconductor component, for example a memory chip, may be produced using the projection exposure apparatus.

The light source can be an EUV light source. Alternatively, use can also be made of a DUV light source, that is to say, for example, a light source with a wavelength of 193 nm.

BRIEF DESCRIPTION OF THE DRAWINGS

Exemplary embodiments of the disclosure is explained in greater detail below with reference to the drawings, in which.

EXEMPLARY EMBODIMENTS OF THE DISCLOSURE

Figure 1:
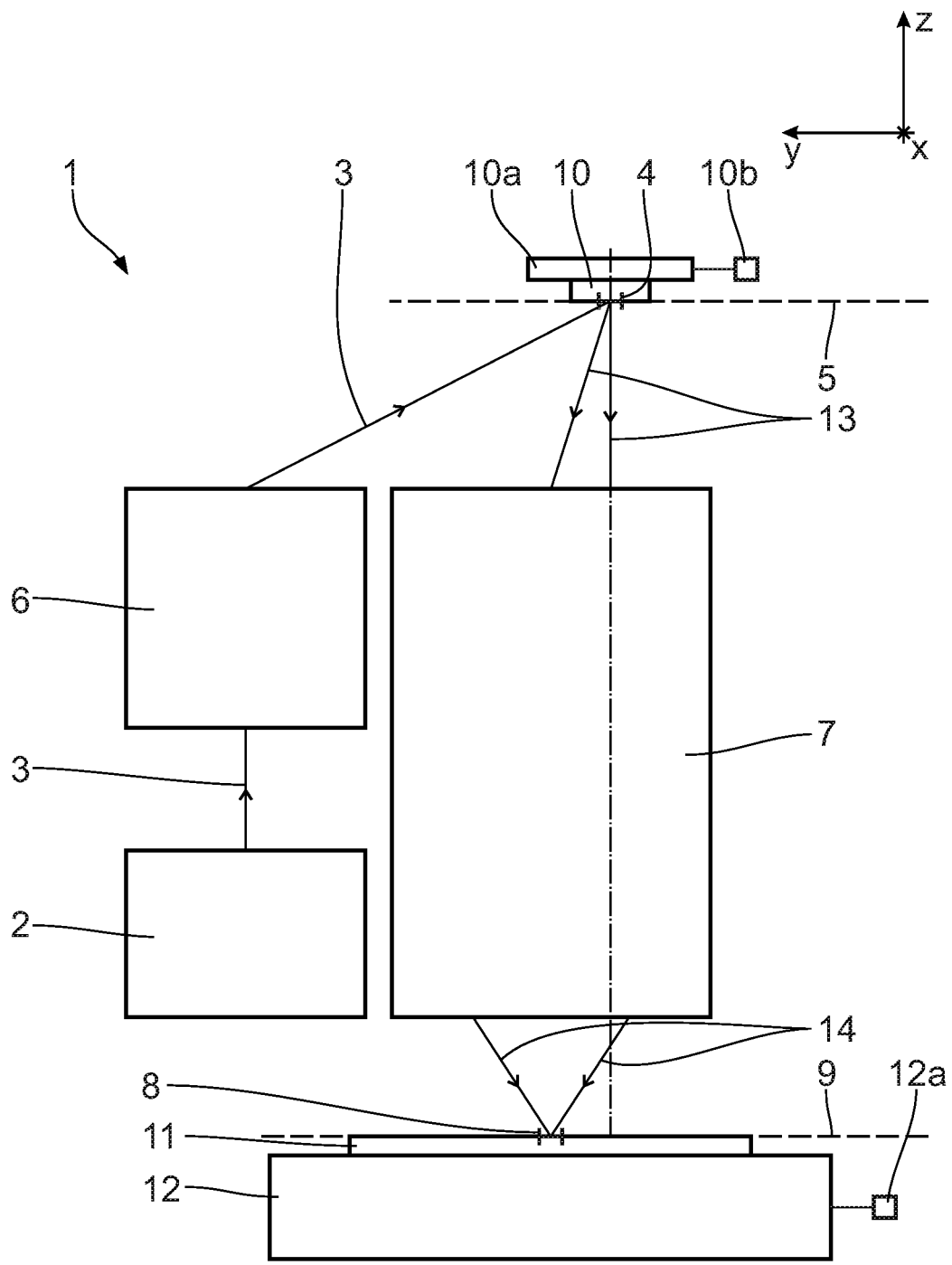
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, such as between 5 nm and 15 nm. The light source 2 can be a plasma-based light source (laser-produced plasma (LPP), gas-discharge produced plasma (GDP)) or else a synchrotron-based light source, for example a free electron laser (FEL). For example, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

In the projection optical unit 7, the object field 4 and the image field 8 have a bent or curved embodiment, for example, an embodiment shaped like a partial ring. A radius of curvature of this field curvature can be 81 mm on the image side. A corresponding ring field radius of the image field is defined in WO 2009/053023 A2. A basic form of a marginal contour of the object field 4 or of the image field 8 has a corresponding bend. Alternatively, it is possible to embody the object field 4 and the image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

The projection optical unit 7 has an x-dimension of the image field of 26 mm and a y-dimension of the image field 8 of 1.2 mm.

Accordingly, the object field 4 is spanned by the first Cartesian object field coordinate x and the second Cartesian object field coordinate y. The third Cartesian coordinate z, which is perpendicular to these two object field coordinates x and y, is also referred to as normal coordinate below.

Figure 2:
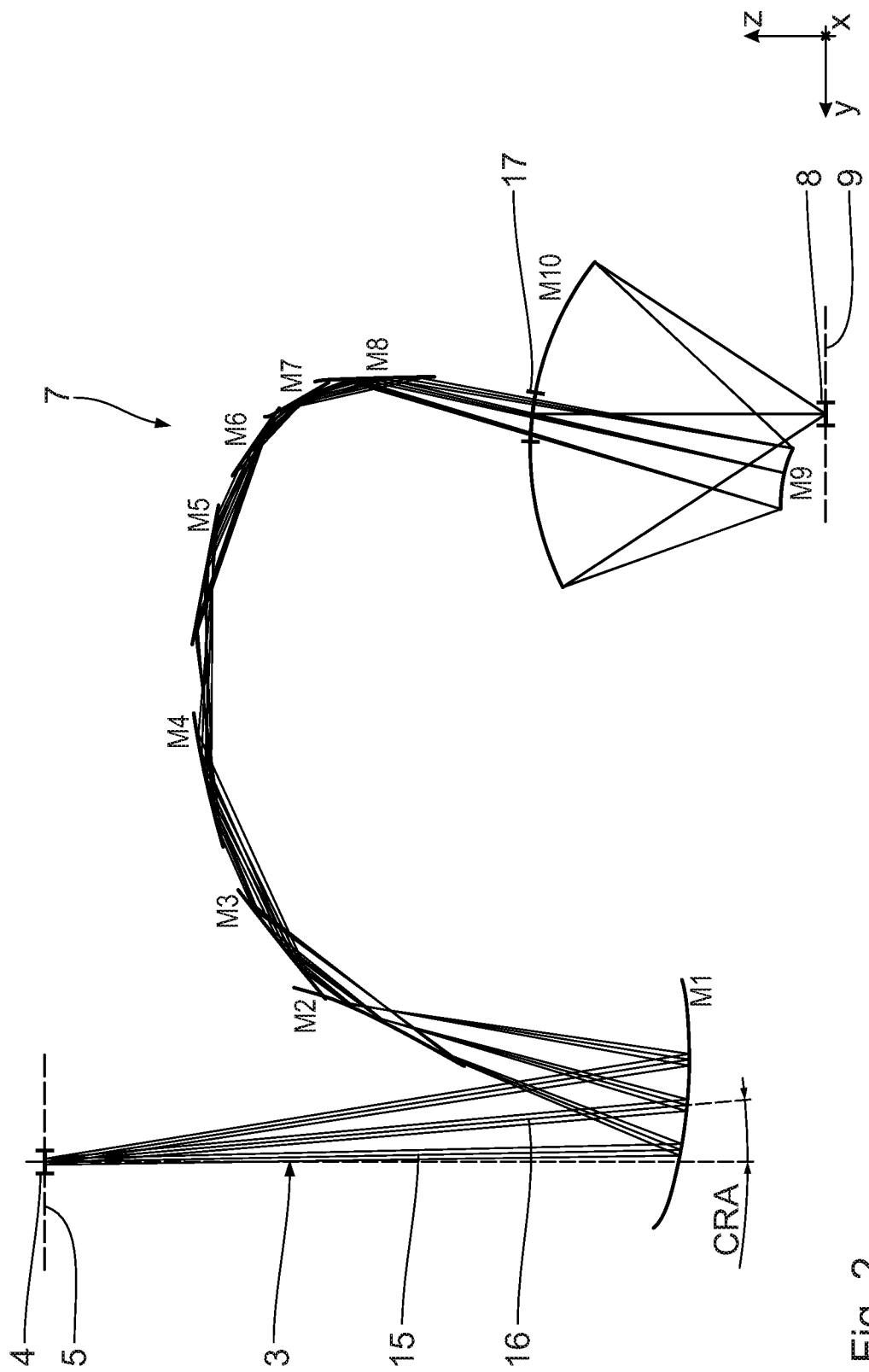
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of three selected field points is depicted.
Figure 3:
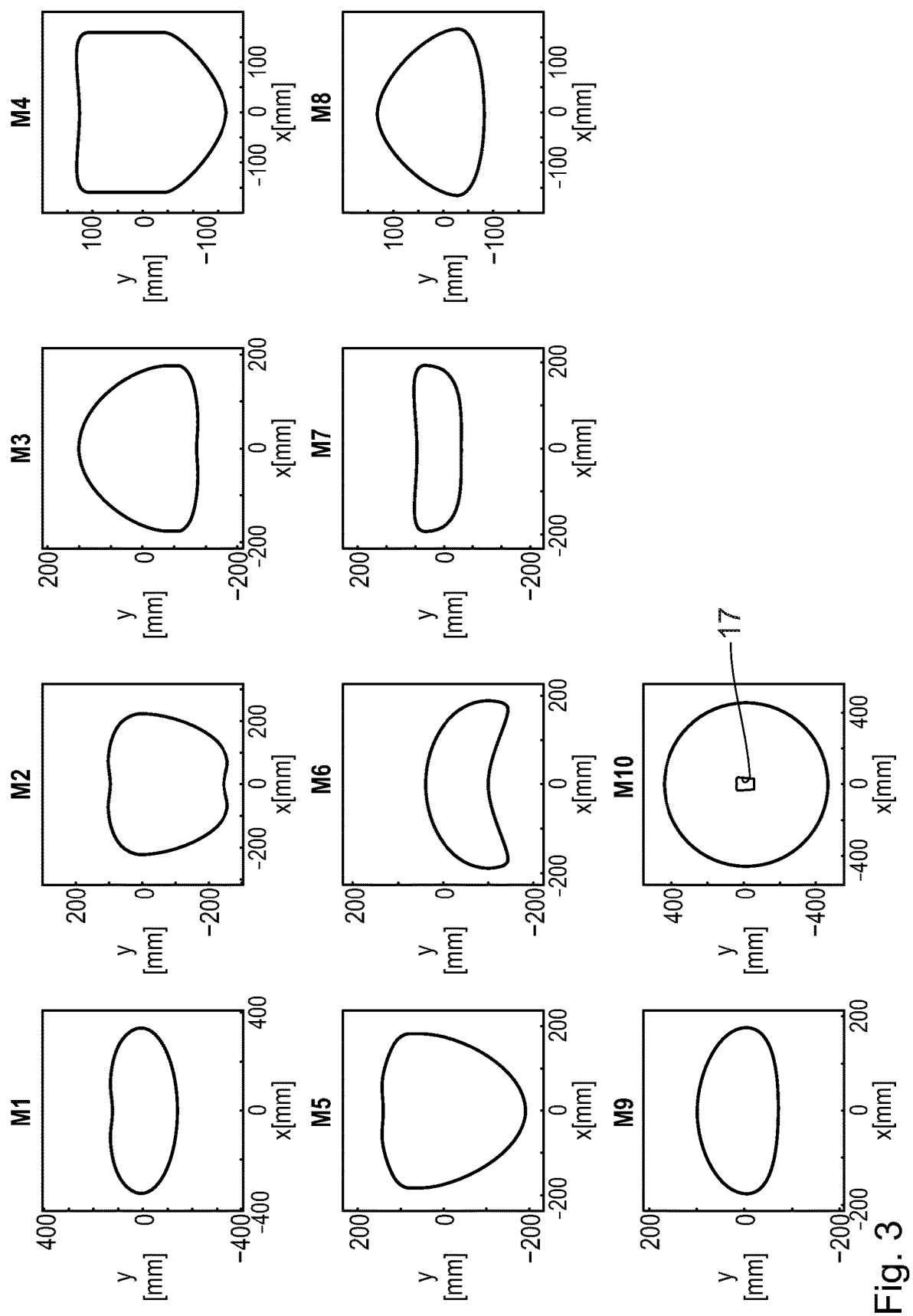
FIG. 3 shows marginal contours of used mirror surfaces of mirrors of the imaging optical unit according to FIG. 2.

The exemplary embodiment depicted in FIG. 2 can be used for the projection optical unit 7. The optical design of the projection optical unit 7 according to FIGS. 2 and 3 is known from WO 2016/188934 A1, the content of which is referred to in its entirety.

In the case of the projection optical unit 7 in the embodiment according to FIG. 2, the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of the projection optical unit 7. FIG. 2 shows the projection optical unit 7 in a meridional section, i.e. the beam path of the imaging light 3 in the yz-plane. The projection optical unit 7 according to FIG. 2 has a total of ten mirrors, which are numbered consecutively by M1 to M10 in the order of the beam path of the individual rays 15, proceeding from the object field 4.

FIG. 2 depicts the beam path of in each case three individual rays 15 emanating from three object field points which are spaced apart from one another in the y-direction in FIG. 2. What is depicted are chief rays 16, i.e. individual rays 15 which pass through the centre of a pupil in a pupil plane of the projection optical unit 7, and in each case an upper coma ray and a lower coma ray of these two object field points. Proceeding from the object field 4, the chief rays 16 include an angle CRA of 5.2° with a normal to the object plane 5.

The object plane 5 lies parallel to the image plane 9.

FIG. 2 depicts sections of the calculated reflection surfaces of the mirrors M1 to M10. A portion of these calculated reflection surfaces is used. Only this actually used region of the reflection surfaces, plus an overhang, is actually present in the real mirrors M1 to M10.

FIG. 3 shows this actually used region of the reflection surfaces of the mirrors M1 to M10. The mirror M10 has a passage opening 17 for the passage of the imaging light 3 which is reflected from the antepenultimate mirror M8 towards the penultimate mirror M9. The mirror M10 is used in a reflective manner around the passage opening 17. None of the other mirrors M1 to M9 has a passage opening and the mirrors are used in a reflective manner in a continuous region without gaps.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. An asphere equation for such a rotationally symmetric asphere is known from DE 10 2010 029 050 A1. It is also possible for all mirrors M1 to M10 to be embodied as such aspheres.

A free-form surface can be described by the following free-form surface equation (equation 1):

$$Z = \frac{c_x x^2 + c_y y^2}{1\sqrt{1 - (1+k_x)(c_x x)^2 - (1+k_y)(c_y y)^2}} \quad (1)$$
$$+ C_1 x + C_2 y$$
$$+ C_3 x^2 + C_4 xy + C_5 y^2$$
$$+ C_6 x^3 + \ldots + C_9 y^3$$
$$+ C_{10} x^4 + \ldots + C_{12} x^2 y^2 + \ldots + C_{14} y^4$$
$$+ C_{15} x^5 + \ldots + C_{20} y^5$$
$$+ C_{21} x^6 + \ldots + C_{24} x^3 y^3 + \ldots + C_{27} y^6$$
$$+ \ldots$$

The following applies to the parameters of this equation (1):

Z is the sag of the free-form surface at the point x, y, where $x^2 + y^2 = r^2$. Here, r is the distance from the reference axis of the free-form surface equation (x=0; y=0).

In the free-form surface equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. $k_x$ and $k_y$ each correspond to a conical constant of a corresponding asphere. Thus, equation (1) describes a biconical free-form surface.

An alternative possible free-form surface can be produced from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and differentiability thereof. Examples for this are analytical functions.

The used reflection surfaces of the mirrors M1 to M10 are carried by main bodies.

Figure 4:
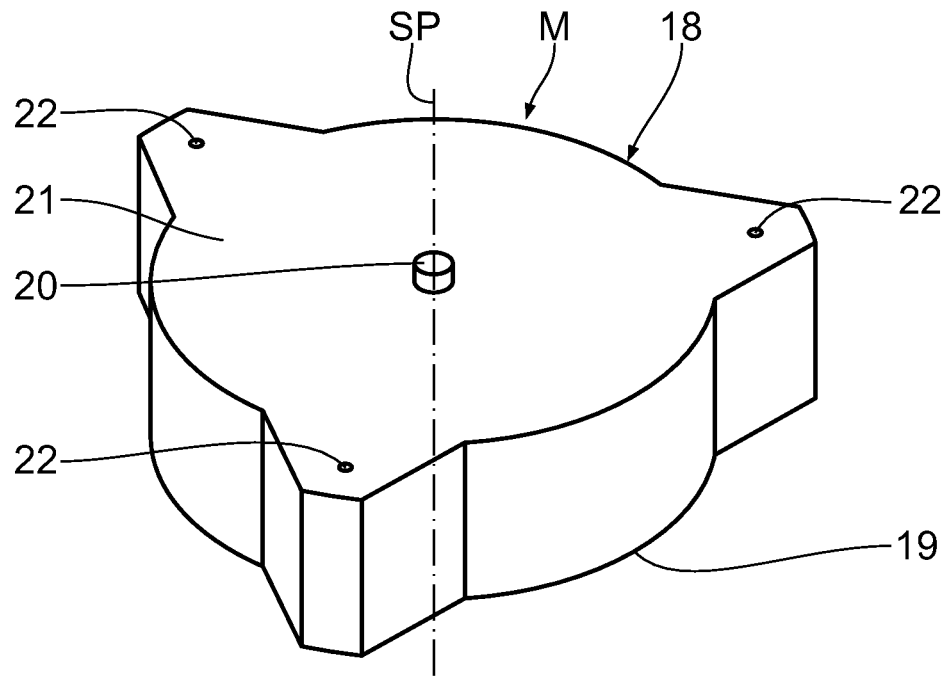
FIG. 4 shows, in a perspective view, a main body of a mirror of the imaging optical unit according to FIG. 2 with a compensation weight element attached to the main body for compensating the weight of a figure deformation of an optical surface of the mirror caused by gravity, wherein the compensation weight element is attached to the main body in the region of a centre-of-mass axis of the mirror.

The main body 18 can be manufactured from glass, from ceramics or from glass ceramics. The material of the main body 18 can be matched in such a way that its coefficient of thermal expansion at a selected operating temperature of the mirror M lies very close to the value of 0 and ideally is exactly 0. Zerodur® is an example of such a material. FIG. 4 shows a perspective view of such a main body 18 in an exemplary manner. Here, the viewing direction is from a mirror rear side, i.e. from a side facing away from the reflectively used mirror surface. The optical surface used for reflections is denoted by 19 in FIG. 4.

The mirror M shown in FIG. 4 can be any one of the mirrors M1 to M10 explained above.

A compensation weight element 20 is attached to the main body 18 in the embodiment of the mirror M according to FIG. 4. The compensation weight element serves to compensate the weight of a figure deformation of the optical surface caused by gravity. Thus, the compensation weight 20 serves to compensate figure errors of the optical surface 19, which result on account of the fact that the mirror M is produced at a production location at which the gravitational force on the mirror M differs from that at the use location of the mirror M where semiconductor components are produced using a projection exposure apparatus, of which the mirror M is a constituent part.

The compensation weight element 20 is attached to the rear side 21 of the main body 18 by way of a coupling unit. Examples for the embodiment of such a coupling unit will still be explained in conjunction with FIGS. 12-16. The compensation weight element 20 is attached to the main body 18 in the region of a centre-of-mass axis SP of the mirror M that is indicated schematically in FIG. 4.

The compensation weight element 20 is connected to the main body 18 in interlocking fashion by way of an undercut catch that is not illustrated in any more detail. To this end, the main body 18 has a recess with an undercut, into which a section of the compensation weight element 20 that is complementary to the recess is latched or clipped, engaging behind this undercut. Alternatively, the compensation weight element 20 can also be connected to the main body 18 in an integrally bonded manner and/or by way of a screwed connection.

In a further embodiment that is not illustrated here, the compensation weight element 20 also can be connected to the main body 18 by way of an interposed interface plate. The interface plate, in turn, can be connected firstly to the compensation weight element 20 and secondly to the main body 18 in an interlocking or integrally bonded manner, as already explained above in conjunction with the connection of the compensation weight element 20 to the main body 18.

The main body 18 has a plurality of bearing sites 22. These are three bearing sites 22 in the illustrated exemplary embodiment. By way of these bearing sites 22, the main body 18 is borne in a bearing receptacle of a holding frame, not illustrated here, of the mirror M.

The following procedure is adopted when producing an adjusted optical element in the style of the mirror M according to FIG. 4:

First, a blank of the mirror M is produced, taking account of a negative deformation allowance at a production location. Here, the optical surface 19 is preformed in such a way that it only has the desired figure under the action of force of at least one compensation weight element in the style of the compensation weight element 20. Subsequently, the blank that is pre-manufactured in this way is moved to the use location of the projection exposure apparatus. There, at least one compensation weight element in the style of the compensation weight element 20 is attached to the main body 18 of the mirror M, taking account of the gravitational acceleration at the use location, for the purposes of compensating the weight of a figure deformation of the optical surface 19 caused by gravity. Provided that the gravitational force at the use location is sufficiently well known, it is also possible to interchange these two last steps of "moving the blank to the use location" and "attaching the at least one compensation weight element". Subsequently, the mirror is adjusted at its use location in the projection exposure apparatus.

In a variant of the mirror production method, a raw compensation weight element can be attached immediately to the main body of the optical element during the production of the blank of the optical element, the raw compensation weight element overcompensating the expected effect of the figure deformation of the optical surface caused by gravity. For the purposes of producing the adjusted optical element, the compensation weight element then can be made lighter in respect of its weight effect on the optical surface by removing part of the compensation weight element, for example by ablation, until the desired weight compensation effect for achieving the desired compensation of the figure deformation is achieved. This variant of the production method avoids subsequently attaching a discharge element to the already completed optical surface, which could lead to an unwanted figure deformation in its own right.

In an embodiment of the mirror M as a symmetric mirror made of ceramics with a mass of 500 kg, a diameter of 90 cm and a thickness of 20 cm, a theoretical figure deformation, caused by a gravitational acceleration variation of 0.1%, is approximately 350 pm. As a result of the weight compensation described above via compensation weight elements, this effect is reducible to approximately 13 pm. Thus, after compensation, less than 4% of the original figure deformation remain.

In general, it is possible to achieve a compensation of the figure deformation caused by gravity to a value of less than 10% of the original figure deformation caused by gravity.

Figure 5:
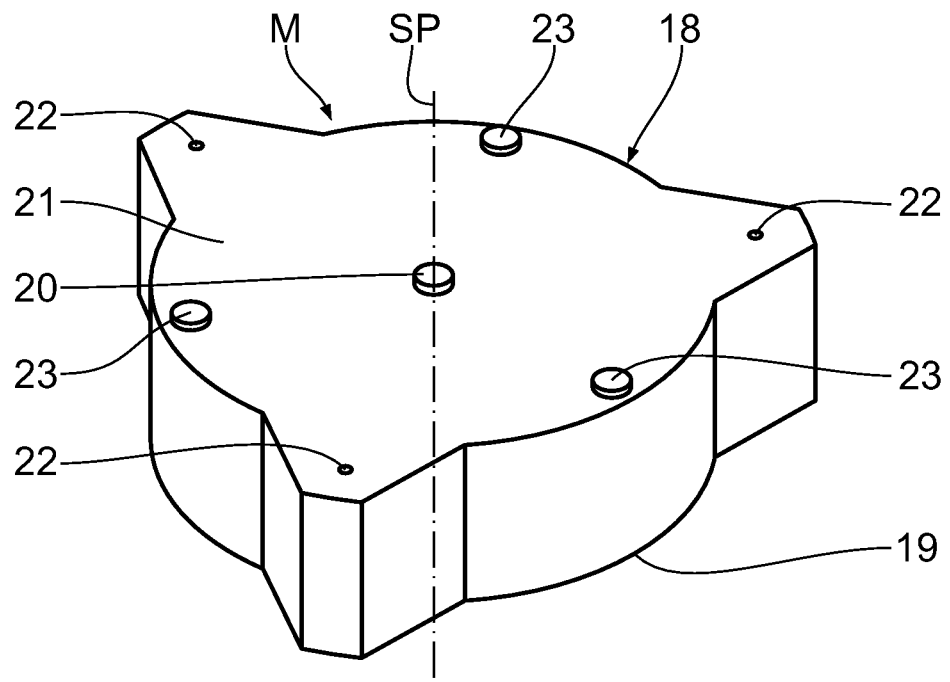
FIG. 5 shows, in an illustration similar to FIG. 3, a further embodiment of an arrangement of compensation weight elements, wherein, in addition to a compensation weight element according to FIG. 3, further compensation weight elements are attached between bearing sites of the main body that are respectively arranged adjacent to one another in the circumferential direction.

FIG. 5 shows a further embodiment of an optical element using the example of a mirror M with a weight-compensated figure deformation of the optical surface caused by gravity. Components and functions that were already explained above in conjunction with FIGS. 1 to 4, for example, in conjunction with FIG. 4, are denoted by the same reference signs and are not discussed in detail again.

In addition to the central compensation weight element 20 in the region of the centre-of-mass axis SP, the main body 18 of the mirror M according to FIG. 5 has further compensation weight elements 23. One of these further compensation weight elements 23 is arranged in each case between two bearing sites 22 that are adjacent to one another in the circumferential direction about the centre-of-mass axis SP. Additional degrees of freedom in the weight compensation of the figure deformation caused by gravity emerge with the aid of such an embodiment having a plurality of compensation weight elements 20, 23. The further compensation weight elements 23 are also attached to the main body 18 via coupling units, which will still be explained below in conjunction with FIG. 12ff.

In a further, not illustrated embodiment of an arrangement of compensation weight elements that otherwise corresponds to the embodiment according to FIG. 5, the central compensation weight element 20 in the region of the centre-of-mass axis SP is missing.

Figure 6:
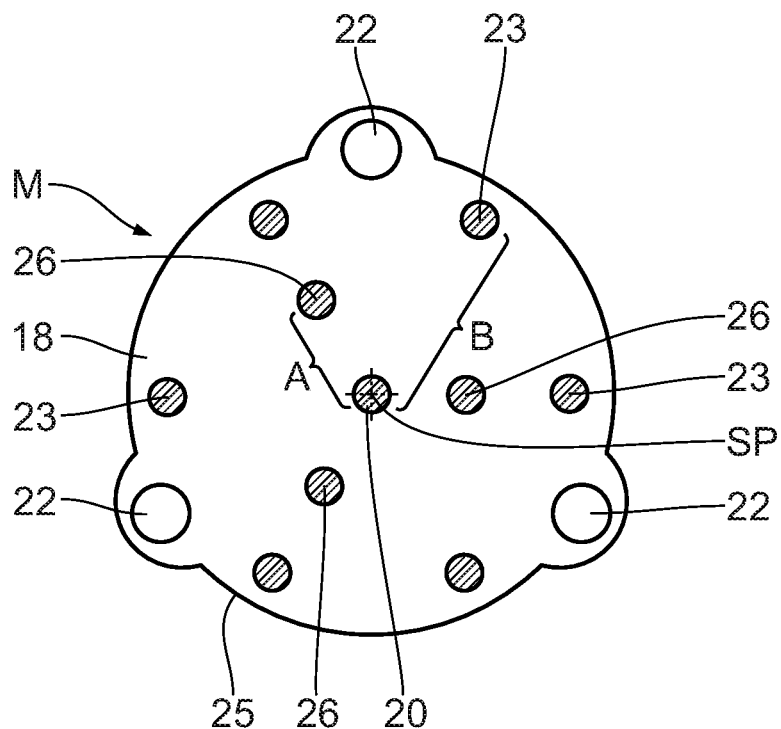
FIG. 6 shows a rear-side view of a main body of a mirror with a further arrangement of compensation weight elements.

FIG. 6 shows a rear-side view of the mirror M with a further arrangement variant of the compensation weight elements.

In the arrangement according to FIG. 6, a centrally arranged compensation weight element 20 in the style of the embodiments of FIGS. 4 and 5 is present. In the embodiment according to FIG. 6, two compensation weight elements 23 are present, in each case, between two bearing sites 22 that are adjacent to one another in the circumferential direction about the centre-of-mass axis SP. Additionally, further compensation weight elements 26 are present radially between the centre-of-mass axis SP and an outer edge region 25 of the mirror M, the further compensation weight elements having half the distance A or the radius value in relation to the central compensation weight element 20 when compared to the outer compensation weight elements 23 arranged on the circumference between the bearing sites 22. The distance between the central compensation weight element 20 and the outer compensation weight elements 23 arranged between adjacent bearing sites 22 is denoted by B in FIG. 6. Thus, the following applies in the embodiment according to FIG. 6: B=2 A.

The further compensation weight elements 26 are also attached to the main body 18 via coupling units, which will still be explained below.

Other ratios B/A in the range of between 1.1 and 10 are also possible. The radial compensation weight elements 26 can all have the same distance A from the central compensation weight element 20. Alternatively, it is possible to provide different distances $A_1$, $A_2$, . . . between the radial compensation weight elements 26 and the central compensation weight element 20.

Overall, three radial compensation weight elements 26 and six circumferential compensation weight elements 23 are present in the arrangement of the compensation weight elements according to FIG. 6 in addition to the central compensation weight element 20; i.e. there is a total of ten compensation weight elements. By way of example, depending on the desired compensation of a figure deformation, the number of compensation weight elements can lie in the range of between 5 and 25.

Figure 7:
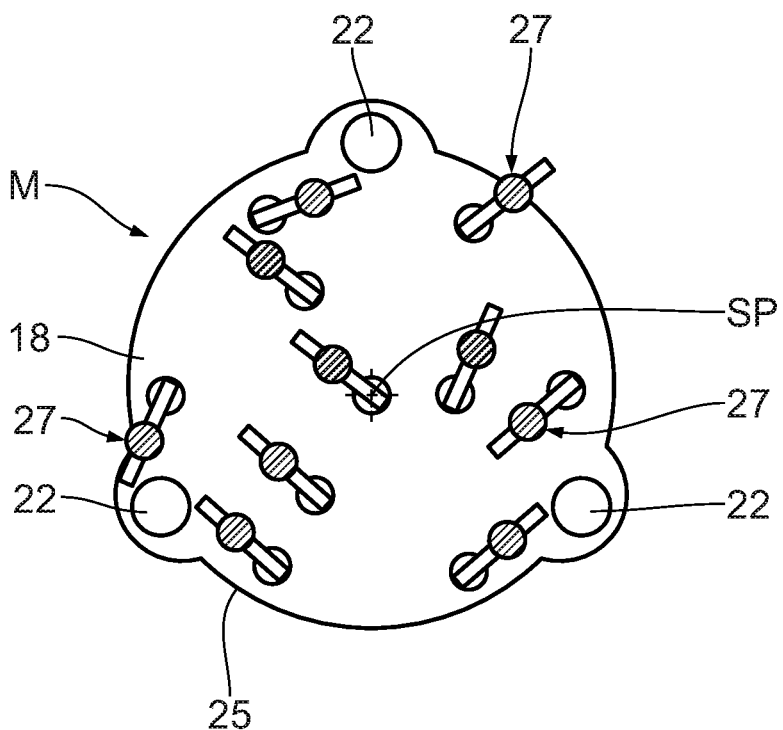
FIG. 7 shows, in an illustration similar to FIG. 6, an arrangement of compensation weight elements, comparable to FIG. 6, in each case embodied with a connecting lever for introducing torque.

While, in principle, having the same arrangement of the compensation weight elements as in FIG. 6, FIG. 7 shows a design of compensation weight elements 27 that is an alternative to the embodiment according to FIGS. 4 to 6, the compensation weight elements being designed as torque compensation weight elements. Thus, overall, ten such torque compensation weight elements 27 are present in the embodiment according to FIG. 7 at the location of the compensation weight elements 20, 23 and 26 of the embodiment according to FIG. 6.

Figure 8:
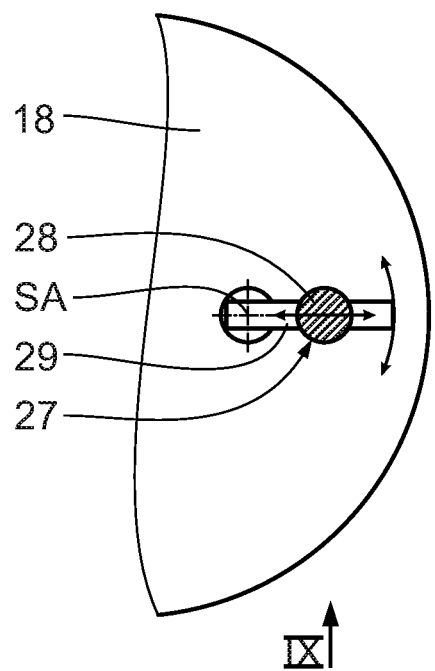
FIG. 8 shows, in a view similar to FIG. 7, one of the compensation weight elements in the style of those of FIG. 7, with additional elucidation of mobility of the compensation weight element along the connecting lever on the one hand and of a pivoting mobility of the connecting lever on the other hand.
Figure 9:
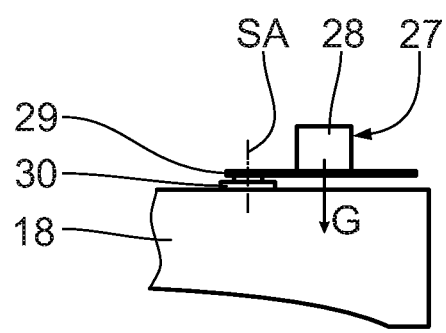
FIG. 9 shows a lateral view of the compensation weight element according to FIG. 8, as seen from the viewing direction IX in FIG. 8.

FIGS. 8 and 9 elucidate the design of a first embodiment of the torque compensation weight elements 27. These each have a compensation weight 28, which is connected to the main body 18 via a connecting lever 29 and an additional element 30 that is designed as an interface. The interface 30 is embodied as a coupling unit, which will still be explained below on the basis of FIG. 12ff.

When the mirror M is oriented in such a way that the rear side thereof points upwards, a direction of a gravitational force G of the compensation weight 28 of the torque compensation weight element 27 extends, proceeding from the centre of mass of the compensation weight 28, at a distance from a connection region by which the connecting lever 29 is connected to the main body 18, i.e. at a distance from the additional element (interface) 30. This results in a torque which the torque compensation weight element 27 introduces into the main body 18 of the mirror M. The introduction of torque can be used for a targeted change of the figure of the opposite optical surface 19 of the mirror that is used for reflection purposes.

In the torque compensation weight element 27, it is possible to predetermine both the magnitude of the introduced torque and the direction thereof in an adjustable manner. In order to predetermine the magnitude of the introduced torque, the compensation weight 28 can be displaced along the connecting lever 29 relative to the latter, as indicated in FIG. 8 by a double-headed arrow in the longitudinal direction of the connecting lever 29.

An effective length of the connecting lever 29 and hence of the absolute value of the introduced torque is set by way of this displacement of this compensation weight 28 along the connecting lever 29. This adjustment of the compensation weight 28 along the connecting lever 29 can be brought about continuously. By way of example, the compensation weight 28 can be affixed magnetically to the connecting lever 29.

A direction of the torque introduced into the main body 18 via the torque compensation weight element 27 can be predetermined by way of a pivot setting of the connecting lever 29 about a pivot axis SA, as indicated in FIG. 8 by a further double-headed arrow. Here, the additional element 30 can be embodied with a pivot bearing to the main body 18, the pivot bearing being fixable in a predetermined pivot position of the connecting lever 29 relative to the main body 18 such that the connecting lever 29 is fixed in this pivot position.

Figure 10:
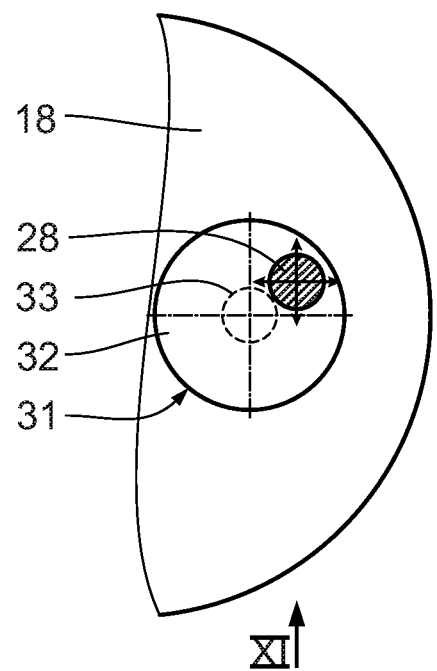
FIGS. 10 and 11 show, in illustrations similar to FIGS. 8 and 9, a further embodiment of a compensation weight element with a connecting lever embodied as a disc.
Figure 11:
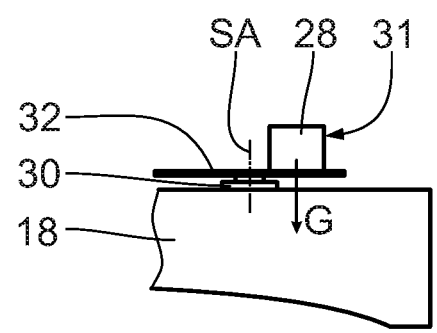

Below, a further embodiment of a torque compensation weight element 31 is described on the basis of FIGS. 10 and 11. Components and functions corresponding to those which were already explained above with reference to FIGS. 1 to 9, for example, with reference to FIGS. 7 to 9, are denoted by the same reference signs and are not discussed in detail again.

Instead of an elongate connecting lever 29 as in the embodiment from FIGS. 7 to 9, the torque compensation weight element 31 has a disc-shaped connecting lever 32. A central region 33 of the connecting lever 32 is connected to the main body 18 via the additional element (interface) 30. The compensation weight 28 can be displaced in two dimensions on the upper side of the connecting lever 32 facing away from the additional element 30, as indicated in FIG. 10 by two crossed double-headed arrows in the region of the compensation weight 28. By way of this displacement with two degrees of translational freedom, it is possible to predetermine both the absolute value and the direction of introduction of the torque of the torque compensation weight element 31 in an adjustable manner. A pivotability or rotatability of the connecting lever 32 is not necessary in this embodiment, although it is also possible in principle.

A further embodiment of a mirror as an optical element with compensation weight elements attached by way of coupling elements is described below on the basis of FIGS. 12 to 16. Components and functions corresponding to those which were already explained above with reference to FIGS. 1 to 11, for example, with reference to FIGS. 4 to 11, are denoted by the same reference signs and are not discussed in detail again.

Compensation weight elements 34 of the type of the compensation weight elements 20, 23, 26 and 27 of the embodiments according to FIGS. 4 to 11 are illustrated schematically in FIGS. 12 to 15 as compensation weight elements 34. As the area of the respectively illustrated compensation weight element 34 increases, so does its weight and its greatest introducible maximum torque contribution.

FIGS. 12 to 16 also schematically indicate bearing sites 22 for bearing the main body 18 on the holding frame of the projection optical unit 7.

At least one coupling unit to 35 is attached to the main body 18 of the mirror M according to FIGS. 12 to 16. These are six such coupling units 35 in the illustrated exemplary embodiment. Depending on the embodiment of the optical element M, the number of such coupling units 35 can lie in the range of between one and thirty, in the range of between one and ten and in the range of between three and ten, for example. Of the six coupling units 35 illustrated in FIGS. 12 to 16, three are equipped with compensation weights 34 with different masses in FIG. 12.

The coupling units 35 are arranged on the mirror rear side 21 of the mirror M. As an alternative or in addition thereto, the coupling units 35 can also be attached in the region of the circumference of the main body 18, for example, at the edge of the main body 18.

Like in the embodiments according to FIGS. 4 to 7, at least one of the coupling units 35 can be arranged on the main body 18 in the region of a centre-of-mass axis of the optical element M.

Arrangements of the coupling units 35 on the main body 18 may correspond to the arrangements of the compensation weight elements, which were already explained above with reference to FIGS. 4 to 7.

The coupling unit to 35 can be embodied as a magnetic interface and can have, for example, a permanent magnet. As an alternative or in addition thereto, the coupling unit 35 can have an electromagnet. As an alternative or in addition thereto, the coupling unit 35 can also be embodied for an interlocking and/or cohesive arrangement of at least one compensation weight in each case.

At least one coupling unit 35 or else some of the coupling units 35 can be arranged on the optical element M in such a way that they remain accessible even once the optical element M has been installed in the projection exposure apparatus 1 such that a weight compensation of a figure deformation of the optical surface 19 by way of a change in the arrangement of appropriate compensation weight elements 34 can be implemented in the installed state of the optical element M.

At least one coupling unit 35 or else some of the coupling units 35 can be configured as integral components of mirror decoupling devices, for example in the form of pins. Such mirror decoupling devices serve to minimize or entirely avoid the effects of external loads on the optical element M, for example, on the optical surface thereof.

The coupling unit 35 is designed in such a way that the compensation weight element 34 can move with a position or displacement tolerance of at most 100 µm. This ensures the function of the weight compensation, particularly in the case of transport and, where present, in the case of transport tremors. Drift effects can be avoided.

Figure 12:
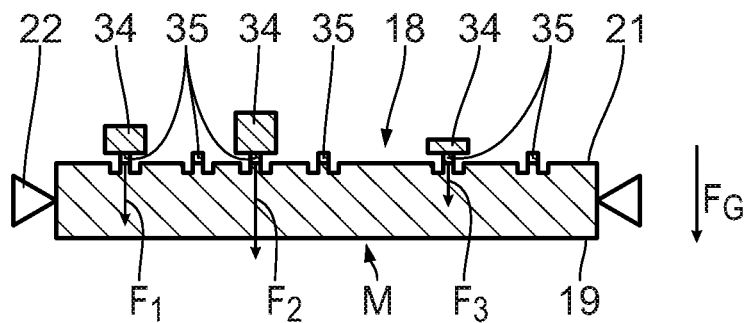
FIG. 12 schematically shows, in a meridional section, an embodiment of the mirror including a plurality of coupling units, arranged on a mirror rear side, for attaching compensation weight elements, with three attached compensation weight elements being illustrated in an exemplary fashion.

FIG. 12 moreover plots the direction of the gravitational force $F_G$, which acts from the mirror rear side 21 in the direction of the optical surface 19, as is the case for the ultimate mirror in the imaging beam path upstream of the image field in the state where it is installed in the projection exposure apparatus 1 with a typical orientation of the projection optical unit 7.

For mirrors M that have been installed in inverted fashion, too, in which the gravitational force $F_G$ acts from the optical surface toward the mirror rear side, a corresponding weight compensation can be realized by compensation weight elements 34 arranged "in suspended fashion" at the mirror rear side by way of appropriate coupling units 35.

A corresponding statement applies to oblique mirrors, in which torque is additionally introduced, even without the configuration as a torque compensation weight element according to FIGS. 7 to 11. In the case of a standing mirror with a vertically arranged mirror rear side 21, it is likewise possible, by way of compensation weight elements 34 attached in the style of FIG. 12, to introduce torque into the main body 18 for the purposes of the weight compensation of a figure deformation of the optical surface 19.

A production of the optical element M with the aid of coupling units 35, by way of which compensation weight elements 34 are attachable, is explained below on the basis of FIGS. 13 to 15.

Figure 13:
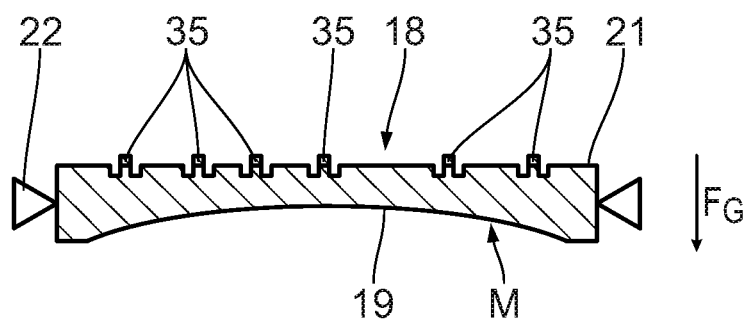
FIGS. 13 to 15 show snapshots, similar to FIG. 12, when producing (FIGS. 13 and 14) and when using (FIG. 15) the optical element according to FIG. 12.

FIG. 13 shows a blank of the optical element M, which is configured with the coupling units 35 but still without compensation weight elements 34. When producing the blank, the optical surface 19 is manufactured taking account of a negative deformation allowance. This can be carried out either by virtue of an allowance being made for the influence of the nominal compensation weight elements 34 for converting an actual form of the optical surface 19 into a predetermined intended form during the manufacturing of the blank according to FIG. 13 or the blank also being able to be implemented using nominal equipment with production compensation weight elements 34, in which the intended form of the optical surface 19 is intended to be reached.

The form of the optical surface is measured after manufacturing the blank according to FIG. 13. This measurement of the actual form of the optical surface 19 can be implemented at the use location of the optical element M, which may differ from the production location. Alternatively, measuring can be carried out at the production location, with the conditions at the use location being taken into account or simulated. The difference between the gravitational acceleration at the production location and at the use location, influences of a holder at the use location and influences of an installation position of the mirror M at the use location on the actual form of the optical surface 19 can be conditions at the use location to be taken into account.

After measuring the optical surface, at least one compensation weight element 34 is attached to the main body 18 of the optical element M via the coupling unit 35 for the purposes of compensating a figure deformation of the optical surface 19 established after the measurement.

Figure 14:
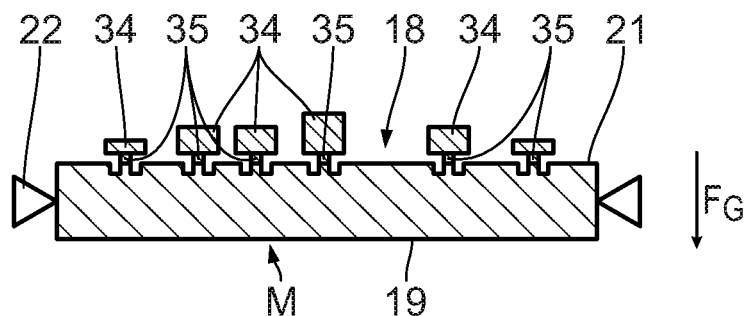

FIG. 14 shows a nominal correction of the negative deformation allowance, in which the set of compensation weight elements 34 leading to the actual form of the optical surface 19 adopting the intended form under otherwise ideal conditions is attached.

Figure 15:
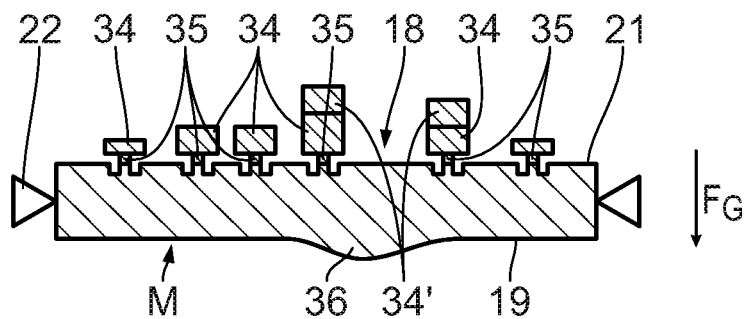

FIG. 15 shows a mass distribution of the compensation weight elements 34 that for an exemplary system correction. In addition to the set of the nominal compensation weight elements 34, two compensation weight elements 34' have been added, the latter ensuring a deformation 36 of the optical surface 19, which is illustrated in very exaggerated fashion in FIG. 15. This deformation 36 either can be a desired intended form or else can serve to compensate the influence of a holder or an installation position in advance.

By attaching appropriate compensating compensation weight elements 34, 34', an intended surface form of the optical surface is achieved within predetermined tolerance limits. Further compensation weight elements 34' can be attached at the use location of the optical element M for the purposes of compensating a use-location-dependent figure deformation of the optical surface 19.

Figure 16:
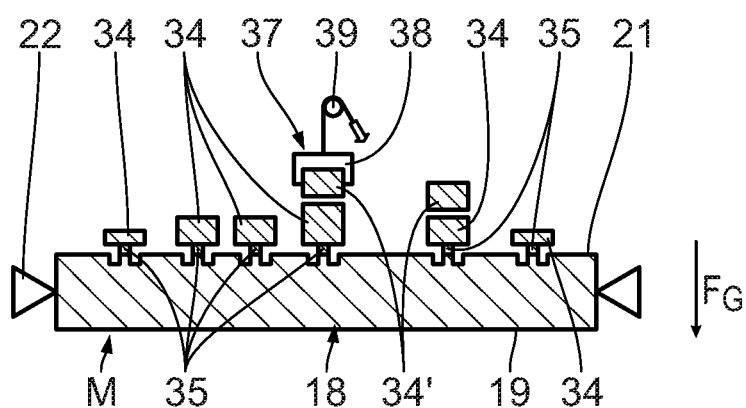
FIG. 16 shows, once again in an illustration similar to FIG. 12, a further embodiment of the optical element with coupling units according to FIG. 12 and an additional storing device for compensation weight elements.

FIG. 16 shows an additional compensation weight storing device 37. By way of the latter, automated equipping of the optical element M with compensation weight elements 34, 34' is provided. The compensation weight storing device has an equipping unit 38, which is embodied to transport exactly one compensation weight element 34 or 34', for example. To this end, the equipping unit 38 has a receptacle with a form that is complementary to the respective compensation weight element 34, 34'. The equipping unit 38 can hold the compensation weight element 34, 34' by a mechanical and/or magnetic mechanism.

By way of a displacement unit 39, indicated schematically as a pulley in FIG. 16, it is possible to transport the respective compensation weight elements 34, 34' between a stored position in a compensation weight store (not illustrated here) and a use position at the location of the respective coupling unit 35.

In order to produce a microstructured or nanostructured component, the projection exposure apparatus 1 is used as follows: first, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An optical element, comprising:
   a main body;
   an optical surface supported by the main body; and
   a coupling unit supported by the main body,
   wherein:
   the coupling unit is configured to attach a compensation weight element to the main body to compensate a figure deformation of the optical surface and so that a positioning of the compensation weight element, relative to the main body in the three degrees of translation, is better than 250 µm.

2. The optical element of claim 1, wherein the optical element comprises a mirror.

3. The optical element of claim 2, wherein the coupling unit is supported by a side of the main body that is opposite to the optical surface.

4. The optical element of claim 3, wherein the optical surface is reflective to EUV light.

5. The optical element of claim 2, wherein the optical surface is reflective to EUV light.

6. The optical element of claim 1, wherein the coupling unit is supported by a side of the main body that is opposite to the optical surface.

7. The optical element of claim 1, wherein the optical element has a center-of-mass axis, and the coupling unit is arranged in the region of a center-of-mass axis of the optical element.

8. The optical element of claim 1, wherein the main body comprises a plurality of bearing sites configured so that the main body is bearable in a bearing receptacle of a holding frame, and the coupling unit is between two bearing sites that are adjacent each other in a circumferential direction of the optical element.

9. The optical element of claim 8, wherein the optical element comprises a plurality of coupling units, and each coupling unit is arranged between a corresponding pair of adjacent bearing sites.

10. The optical element of claim 1, further comprising the compensation weight element connected to the main body via the coupling unit.

11. The optical element of claim 10, further comprising a compensation weight storing device configured to automatically equip the optical element with compensation weight elements.

12. The optical element of claim 1, wherein:
the optical element comprises a mirror;
the optical element has a center-of-mass axis; and
the coupling unit is arranged in the region of a center-of-mass axis of the optical element.

13. The optical element of claim 1, wherein:
the optical element comprises a mirror;
the main body comprises a plurality of bearing sites configured so that the main body is bearable in a bearing receptacle of a holding frame; and
the coupling unit is between two bearing sites that are adjacent each other in a circumferential direction of the optical element.

14. The optical element of claim 1, further comprising the compensation weight element connected to the main body via the coupling unit, wherein the optical element comprises a mirror.

15. An optical unit, comprising:
an optical element according to claim 1,
wherein the optical unit is an imaging optical unit configured to image an object field into an image field.

16. The optical element of claim 1, wherein the optical surface is reflective to EUV light.

17. An optical system, comprising:
an imaging optical unit comprising an optical element according to claim 1; and
an illumination optical unit,
wherein the optical unit is an imaging optical unit configured to image an object field into an image field, and the illumination optical unit is configured to illuminate the object field.

18. An apparatus, comprising:
a light source configured to produce illumination light;
an imaging optical unit comprising an optical element according to claim 1; and
an illumination optical unit,
wherein:
the optical unit is an imaging optical unit configured to image an object field into an image field;
the illumination optical unit is configured to illuminate the object field with the illumination light; and
the apparatus is a projection exposure apparatus.

19. A method of using a projection exposure apparatus comprising an illumination optical unit and an imaging optical unit, the method comprising:
using the illumination optical unit to illuminate a reticle in an object field of the imaging optical unit; and
using the imaging optical unit to project a structure of the reticle onto a light-sensitive layer in an image field of the imaging optical unit,
wherein the imaging optical unit comprises an optical element according to claim 1.

20. A method of making an optical element comprising a main body, an optical surface carried by the main body, and a coupling unit arranged on the main body, the coupling unit configured to attach a compensation weight element to compensate a figure deformation of the optical surface, the method comprising:
producing a blank of the optical element comprising the coupling unit, taking account a negative deformation allowance;
measuring a form of the optical surface of the optical element; and
attaching the compensation weight element to the main body of the optical element via the coupling unit to compensate a figure deformation of the optical surface.

* * * * *

UNITED STATES PATENT AND TRADEMARK OFFICE
CERTIFICATE OF CORRECTION

PATENT NO. : 10,989,897 B2
APPLICATION NO. : 16/923057
DATED : April 27, 2021
INVENTOR(S) : Stefan Hembacher and Marwene Nefzi It is certified that error appears in the above-identified patent and that said Letters Patent is hereby corrected as shown below:

In the Specification

Column 2, Line 42, delete "element" and insert -- element. --.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*